United States Patent [19]

Williams

[11] Patent Number: 4,678,944
[45] Date of Patent: Jul. 7, 1987

[54] CIRCUIT FOR IMPROVING PERFORMANCE OF AN ECL-TO-TTL TRANSLATOR

[75] Inventor: Bertrand J. Williams, San Jose, Calif.

[73] Assignee: Advanced Micro Devices, Inc., Sunnyvale, Calif.

[21] Appl. No.: 733,681

[22] Filed: May 13, 1985

[51] Int. Cl.[4] .................. H03K 19/092; H03K 19/088
[52] U.S. Cl. ................................... 307/475; 307/443; 307/567; 307/317 A
[58] Field of Search ............... 307/475, 473, 443, 567, 307/455, 467, 590, 600, 603, 605, 563, 558, 546, 303, 317 A

[56] References Cited

U.S. PATENT DOCUMENTS

| | | | |
|---|---|---|---|
| 3,534,281 | 10/1970 | Hillhouse | 307/562 |
| 4,467,223 | 8/1984 | Neely | 307/473 |
| 4,581,550 | 4/1986 | Ferris et al. | 307/473 |

OTHER PUBLICATIONS

Chang, "Diode/Transistor Buffer", IBM Disclosure Bulletin, vol. 19, No. 3, Aug. 1976, pp. 989-990.

Primary Examiner—Stanley D. Miller
Assistant Examiner—Timothy P. Callahan
Attorney, Agent, or Firm—Patrick T. King; Davis Chin; J. Vincent Tortolano

[57] ABSTRACT

A logic level translator having a fast rising edge at its output for converting ECL logic levels into TTL logic levels includes a switching transistor having its base adapted to receive an input logic level signal representative of an ECL signal, the collector of the switching transistor being connected to an output node. A clamp delay circuit is interconnected between the collector and the base of the switching transistor for inhibiting the switching transistor from receiving feedback current to its base so as to cause a faster turn-off, thereby producing a fast rising edge response at the output node during a high-to-low transition of the input logic level signal.

12 Claims, 6 Drawing Figures

CIRCUIT FOR IMPROVING PERFORMANCE OF AN ECL-TO-TTL TRANSLATOR

BACKGROUND OF THE INVENTION

This invention relates generally to logic level translators and more particularly, it relates to a logic translator having a fast rising edge which is used to interface between an emitter-coupled-logic (ECL) input stage and a transistor-transistor-logic (TTL) output stage.

Heretofore, computer data processing systems utilize various types of logic in different parts of the processing system. In order to transfer data from one part of the processing system to another part, there is often required a translation from one type of logic to another type of logic. Since many of these processing systems are designed wtih both ECL and TTL logic circuits, there has been encountered a need for interface circuits such as ECL-to-TTL and TTl-to-ECL translators so that these types of logic circuits will be compatible with each other.

As is generally known in the art, TTL logic circuits typically operate on logic signal levels below 0.3 volts and above 3.5 volts and ECL logic circuits typically operate on different logic signal levels. While the precise levels utilized in the ECL logic circuits differ among manufacturers, the voltage swing between the two ECL logic levels is commonly less than the voltage swing between two TTL logic levels. Thus, in order to shift or convert ECL logic level signals to TTL logic level signals, it can be seen that that smaller ECL input swing must result in a larger TTL output swing. One of the major problems experienced is that these level translator circuits tend to cause too large of a propagation delay in transmitting data from the input to the output. In other words, the response time is relatively slow during switching between the low and high output logic levels.

A logic level translator of the prior art is shown in FIG. 1 and has been labeled "Prior Art". The prior art translator 10 is interconnected between an ECL input stage 12 and a TTL output stage 14. The logic level translator of the present invention is an improvement over the translator circuit of FIG. 1 which exhibits a faster rising edge at the input to the TTL output stage 14. The propagation delay during a high-to-low output transition at such output stage of the present level translator is reduced by approximately 2 nanoseconds over the translator circuit of FIG. 1.

SUMMARY OF THE INVENTION

Accordingly, it is a general object of the present invention to provide an improved logic level translator for coverting ECL logic levels into TTL logic levels.

It is an object of the present invention to provide a logic level translator for converting ECL logic levels into TTL logic levels which has a high speed of operation.

It is another object of the present invention to provide a logic level translator having a fast rising edge which is used to interface between an ECL input stage and a TTL output stage.

It is still another object of the present invention to provide a logic level translator having a fast rising edge which includes a switching transistor and a clamp delay network connected between the collector and base of the switching transmitter so as to produce a quick turn off of the switching transistor.

It is still another object of the present invention to provide a logic level translator which includes a transient clamp delay network for quickly turning off a switching transistor during a high-to-low transition of an input logic level signal representative of an ECL signal.

In accordance with these aims and objectives, the present invention is concerned with the provision of a logic level translator having a fast rising edge for converting ECL logic levels into TTL logic levels which includes a switching transistor having its base connected to one end of a first resistor, its collector connected to a supply potential via a second resistor, and its emitter connected to a ground potential. The other end of the first resistor is adapted to receive an input logic level signal representative of an ECL signal. A first diode has its cathode connected to the collector of the transistor and its anode connected to the supply potential via a third resistor. A second diode has its anode connected to the anode of the first diode and its cathode connected to an output node. A third diode has its cathode connected to the cathode of the first diode and its anode connected to the cathode of the second diode. A clamp delay network is interconnected between the collector and the base of the switching transistor for inhibiting the transistor from receiving feedback current to its base so as to cause a faster turnoff. As a result, a fast rising edge response is obtained at the output node which is the input to the TTL output stage during a high-to-low transition of the input logic level signal.

In another aspect of the present invention, the first, second and third diodes forming a level-shifter are replaced by a Schottky transistor. The Schottky transistor has its base connected to the third resistor, its emitter connected to the collector of the switching transistor and its collector connected to the output node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
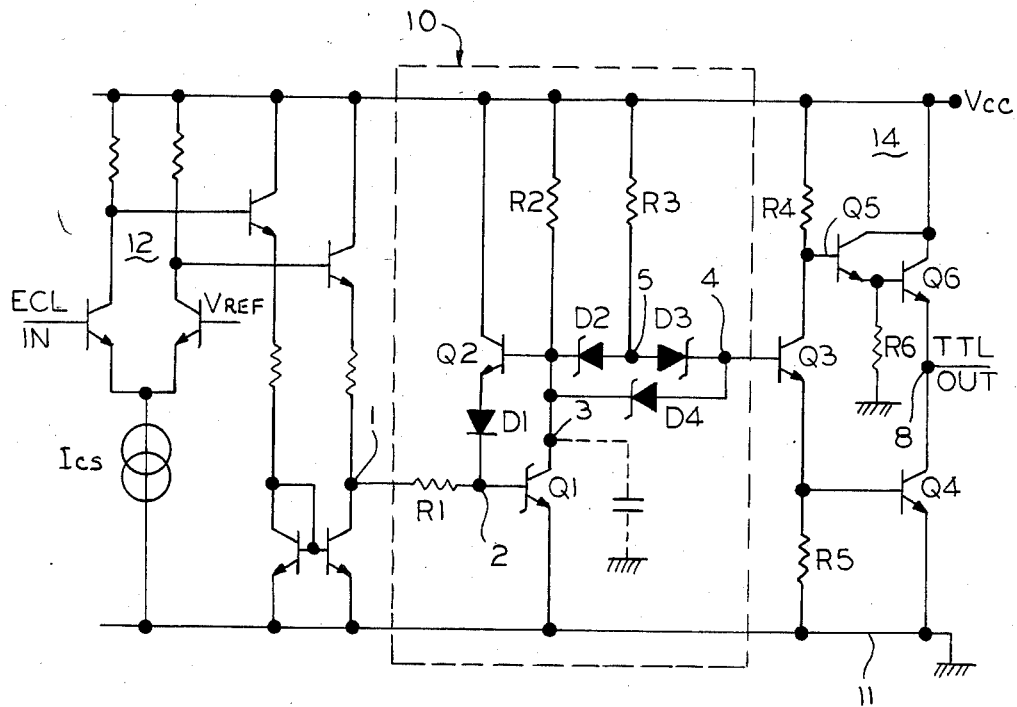
FIG. 1 is a detailed schematic circuit diagram of the ECL-to-TTL logic translator of the prior art which is interfaced between an ECL input stage and a TTL output stage.

Referring now in detail to the various views of the drawings, there is shown in FIG. 1 a detailed schematic circuit diagram of a prior art logic level translator 10 for converting ECL logic level signals to TTL logic level signals. The translator 10 is interconnected between an ECL input stage 12 and a TTL output stage 14. The input of the translator 10 is connected to the output of the ECL input stage 12. The output of the translator 10 is connected to the input of the TTL output stage 14.

Figure 2:
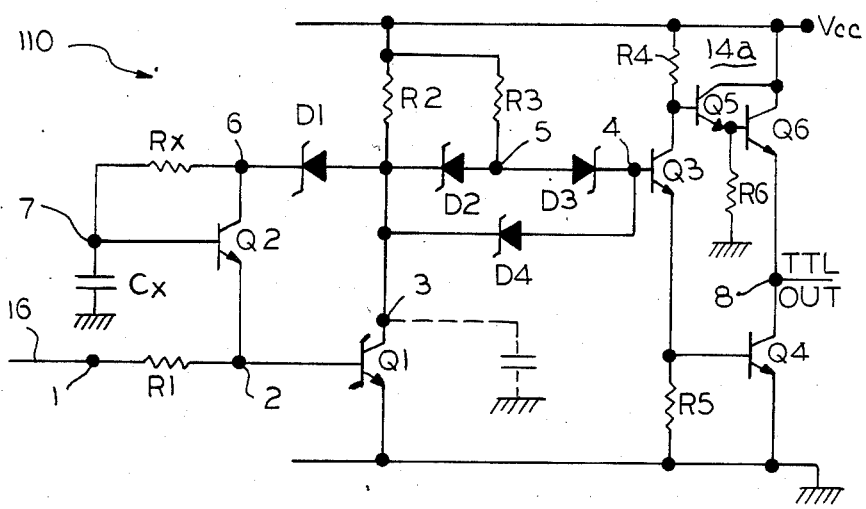
FIG. 2 is a detailed schematic circuit diagram of the logic level translator of the present invention.

FIG. 2 is a detailed schematic circuit diagram of a logic level translator 110 of the present invention which represents an improvement over the translator circuit 10 of FIG. 1. The logic level translator 110 includes a bipolar switching transistor Q1 of the NPN-type. The collector of the transistor Q1 is connected via a resistor R2 to a TTL power supply voltage or potential VCC which is preferably +5.0 volts. The emitter of the transmitter Q1 is connected to a ground potential. The base of the transistor is connected to one end of a resistor R1. The other end of the resistor R1 is connectable to the output of the ECL input stage 12 (FIG. 1) via node 1 and lead line 16 for receiving an input logic level signal representative of an ECL signal. Node 1 is defined as the input of the translator 110. When a higher voltage level representing the input logic level "1" is applied to the lead line 16, the transistor Q1 will be rendered more conductive. On the other hand, when the lower voltage level representing the input logic level "0" is applied to the line 16, the transistor Q1 will be rendered less conductive. The transistor Q1 is preferably a Schottky transistor so as to prevent saturation and thus increases its switching speed.

The collector of the transistor Q1 (node 3) is also connected to the cathode of Schottky diodes D2 and D4. The anode of the diode D2 is connected to the anode of Schottky diode D3 and to one end of a resistor R3 (node 5) whose other end is tied to the supply potential VCC. The anode of the diode D4 is connected to the cathode of the diode D3 and to a node 4 which is defined as the output of the translator 110.

The output of the translator 110 is also connected to the input of a TTL output stage 14a which is identical in construction to the TTL output stage 14 of FIG. 1. The output stage 14a includes a transistor Q3 which has its base connected to the output of the translator at node 4, its collector connected via a resistor R4 to the supply potential VCC, and its emitter connected via a resistor R5 to the ground potential. The collector of the transistor Q3 is further connected to the base of a transistor Q5. The collector of the transistor Q5 is tied to the collector of a transistor Q6 and to the supply potential VCC. The emitter of the transistor Q5 is tied to one end of a resistor R6 and to the base of the transistor Q6. The other end of the resistor R6 is joined to the ground potential. The emitter of the transistor Q6 is connected to the collector of a transistor Q4 and to a node 8 which is defined as the output of the TTL output stage 14a. The base of the transistor Q4 is joined to the junction of the emitter of the transistor Q3 and the resistor R5. The emitter of the transistor Q4 is tied to the ground potential. It will be noted that the transistor Q3 through Q6 are bipolar transistors of the NPN-type.

In the translator circuit 10 of FIG. 1, when the input logic level signal representative of an ECL signal makes a high-to-low transition at node 1, the current to the base of the transistor Q1 drops and the transistor Q1 should turn off immmediately so that the collector potential at node 3 will rise quickly toward the supply potential. This is necessary so the current supplied by resistor R3 will flow into the base of the transistor Q3, thereby quickly turning it on. As a result, the transistor Q4 will also turn on quickly so that the TTL output level signal at node 8 will fall rapidly as it makes a high-to-low transition. However, the problem with the circuit 10 is that the rise time at node 3 is limited by the subthreshold currents in the transistor Q2 and the dioe D1 which causes the transistor Q2 to turn on before a clamp voltage equal to the sum of the base-to-emitter voltages of the transistors Q1, Q2 and the forward voltage drop of the Schottky diode D1 or $2V_{BE}+V_{SH}$ is reached. This in turn causes added current to flow into the base of the transistor Q1 which then draws more collector current from the resistor R3 and reduces the amount of current that can be supplied into the base of the transistor Q3. Thus, a fast turn-off time for the transistor Q1 is not realized, thereby preventing a fast turn-on time for the transistor Q3.

In order to increase the rise time at node 3 in response to the input logic level signal making a high-to-low input edge or transition, a clamp delay circuit is provided which consists of a Schottky diode D1, a bipolar transistor Q2 of the NPN-type, a resistor $R_X$ and a capacitor $C_X$. The anode of the diode D1 is connected to the collector (node 3) of the transistor Q1. The transistor Q2 has its collector (node 6) connected to the cathoe of the diode D1 and to one end of the resistor $R_X$. The emitter of the transistor Q2 is tied to the base of the transistor Q1. The other end of the resistor $R_X$ is connected to one end of the capacitor $C_X$ and to the base of the transistor Q2. The other end of the capacitor $C_X$ is tied to the ground potential.

The operation of the translator 110 of the present invention shown in FIG. 2 will now be described in connection with the waveform diagrams of FIGS. 3(a) through 3(c). Typically, the input logic level signal at node 1 swings between approximately 200 mv above and below the base-to-emitter voltage $V_{BE}$ of the transistor Q1. As can be seen from FIG. 3(a), the logic "1" level of the input signal is about 800 mv and the logic "0" of the input signal is about 400 mv. On the other hand, the TTL output logic level at node 8 swings between +5 volts representing the logic "1" level and 0.25 volts representing the logic "0" level.

During a high-to-low transition (curve A of FIG. 3a) of the input logic level signal at node 1, current will be pulled out of the base of the transistor Q1 so as to render it less conductive. As a result, the collector potential at the node 3 will rise quickly with a fast rising edge sicne no base current will be supplied or fed back from the transistor Q2 into the base of the transistor Q1 until the voltage at the node 7 exceeds the threshold voltage of the transistor Q2. The combination of the resistor $R_X$ and the capacitor $C_X$ prevents the premature or early turn-on of the transistor Q2 and inhibits or delays the feedback of the current into the base of the transistor Q1 thereby increasing the rise rate or the rising edge at node 3.

As a consequence, base drive current will be delivered quicker to the input of the TTL output stage 14a or the base of the transistor Q3 which causes it to turn on quickly. This, in turn, provides positive base drive to the transistor Q4 which turns it on rapidly so that the output potential at the node 8 (FIG. 3b) falls quickly as the transistor Q4 turns on.

Figure 3:
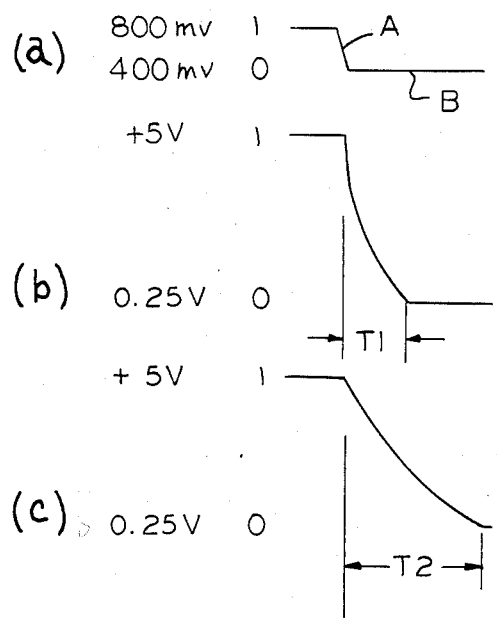
FIG. 3(a)–3(c) are waveform diagrams useful in understanding the operation of the logic level translator of FIG. 2.

After the high-to-low transition occurs at the input at node 1, the input signal will remain in the low state (curve B of FIG. 3a). At this steady-stage condition, the clamp delay circuit will provide a static voltage at node 3 so as to produce a bias potential on the base of the transistor Q1. This bias potential keeps the transistor Q1 turned on enough to pull current through the resistor R2 and to clamp the voltage at the collector of the transistor Q1. This bias also allow the transistor Q1 to turn on quicky when a low-to-high transition is received at the node 1.

FIG. 3(c) shows the TTL output response at the node 8 of FIG. 1 when a high-to-low transition similar to that of FIG. 3(a) is applied to the node 1. By comparing FIG. 3(b) and FIG. 3(c), it can be seen that the time T1 of the TTL output stage of FIG. 2 is shorter than the time T2 of the TTL output stage of FIG. 1. The time T1 is approximately 2 nanoseconds less than the time T2 for the high-to-low TTL output logic level transition.

Figure 4:
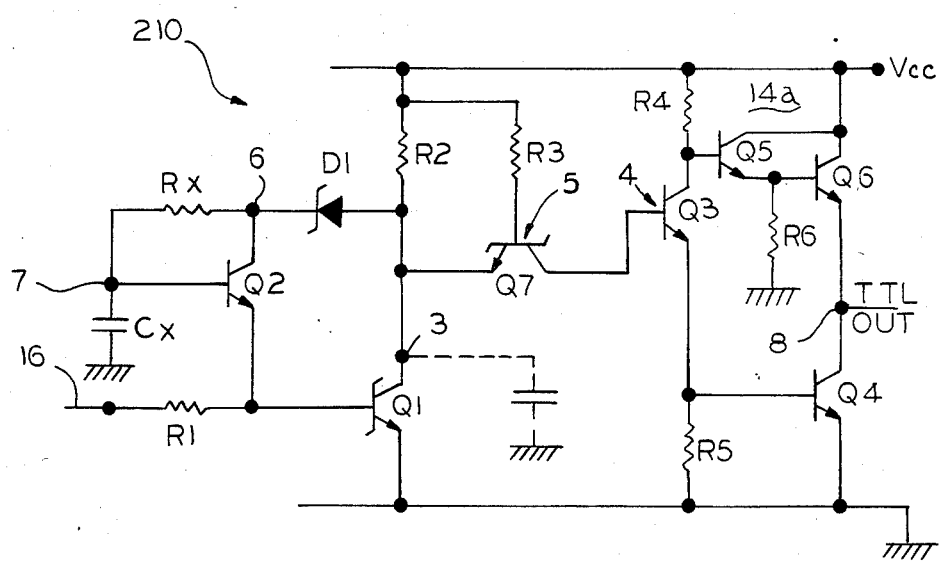
FIG. 4 is a detailed schematic circuit diagram of a second embodiment of the logic level translator of the present invention.

In FIG. 4, there is shown a detailed schematic circuit diagram of a second embodiment of a logic level translator 210 of the present invention. The logic level translator 210 is identical in construction to the translator 110 of FIG. 2, except that the Schottky diodes D2, D3 and D4 are replaced by a single Schottky transistor Q7. It should be understood by those skilled in the art that this alternate arrangement is possible since both the diodes and the single transistor serve as a level-shifting means for converting the voltage at the collector of the switching transistor Q1.

As can be seen, the level-shifting Schottky transistor Q7 has its base connected to the supply potential VCC via the resistor R3 (node 5). The emitter of level-shifting transistor Q7 is connected to the collector of the switching transistor Q1, and the collector of the transistor Q7 is connected to the output node 4 which is the input to the TTL output stage 14a. Since the translation 210 is identical in function and operation to the translator 110 of FIG. 2, its detailed manner of operation will not be repeated.

From the foregoing detailed description, it can thus be seen that the present invention provides an improved logic level translator having a fast rising edge for converting ECL logic levels into TTL logic levels. This is accomplished by a clamp delay circuit which inhibits or delays the feedback of current into a switching transistor so as to facilitate its quick turn-off time during a high-to-low transition of an input logic level signal representative of an ECL signal. It should be understood by those skilled in the art that all of the circuit components for the present translator may be formed on a single silicon chip of a semiconductor integrated circuit.

While there has been illustrated and described what is at present to be considered preferred embodiments of the present invention, it will be understood by those skilled in the art that various changes and modifications may be made, and equivalents may be substituted for elements thereof, without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments falling within the scope of the appended claims.

What is claimed is:

1. A logic level translator having a fast rising edge at its output for converting ECL logic levels into TTL logic levels, said translator comprising:
   a switching transistor having its base connected to one end of a first resistor, its collector connected to a supply potential via a second resistor, and its emitter connected to a ground potential;
   the other end of said first resistor being connected to receive an ECL signal;
   a first diode having its cathode connected to the collector of said switching transistor and its anode connected to the supply potential via a third resistor;
   a second diode having its anode connected to the anode of said first diode and its cathode connected to an output node;
   a third diode having its cathode connected to the cathode of said first diode and its anode connected to the cathode of said second diode;
   clamp delay means interconnected between the collector and the base of said switching transistor for inhibiting the transistor from receiving feedback current to its base so as to cause a faster turn-off, whereby a fast rising edge response is obtained at TTL logic levels during a high-to-low transition of the input logic level signal;
   said clamp delay means including a fourth diode, a second transistor, a fourth resistor and a capacitor; and
   said fourth diode having its anode connected to the collector of said switching transistor, the collector of said second transistor being connected to the cathode of said fourth diode and to one end of the fourth resistor, the emitter of said second transistor being connected to the base of said switching transistor, the other end of said fourth resistor being connected to one end of the capacitor and to the base of said second transistor, the other end of said capacitor being connected to the ground potential.

2. A logic level translator as claimed in claim 1, wherein said switching transistor comprises a Schottky transistor.

3. A logic level translator as claimed in claim 1, wherein said first, second and third diodes are Schottky diodes.

4. A logic level translator as claimed in claim 1, wherein said fourth diode is a Schottky diode.

5. A logic level translator as claimed in claim 4, wherein said second transistor is a bipolar transistor of the NPN-type.

6. A logic level translator as claimed in claim 1, wherein said supply potential is +5.0 volts.

7. A logic level translator as claimed in claim 1, wherein the TTL output logic level signals are +5 volts representing the logic level "1" and 0.25 volts representing the logic level "0".

8. A logic level translator having a fast rising edge at its output for converting ECL logic levels into TTL logic levels, said translator comprising:
   switching means having an input and an output, said input being connected to receive an input logic level signal representative of an ECL signal;
   clamp delay means interconnected between said input and said output of said switching means for facilitating the fast turn-off of said switching means whereby a fast rising edge response is obtained at TTL logic levels during a high-to-low transition of the input logic level signal;
   said clamp delay means including a diode, a bipolar transistor, a resistor and a capacitor; and
   the diode having its anode connected to the output of said switching means, the collector of said bipolar transistor being connected to the cathode of the diode and to one end of the resistor, the emitter of the bipolar transistor being connected to the input of said switching means, the other end of the resistor being connected to one end of the capacitor and to the base of the bipolar transistor, the other end of the capacitor being connected to a ground potential.

9. A logic level translator as claimed in claim 8, wherein said switching means comprises a Schottky transistor.

10. A logic level translator as claimed in claim 8, wherein said diode is a Schottky diode.

11. A logic level translator as claimed in claim 10, wherein said bipolar transistor is of the NPN-type.

12. A logic level translator having a fast rising edge at its output node for converting ECL logic levels into TTL logic levels, said translator comprising:
- a switching transistor having its base connected to one end of a first resistor, its collector connected to a supply potential via a second resistor, and its emitter connected to a ground potential;
- the other end of said first resistor being connected to receive an ECL signal;
- level-shifting means coupled between the collector of said switching transistor and an output node for converting the voltage at the collector of said switching transistor;
- said level-shifting means including a Schottky transistor having its base connected to the supply potential via a third resistor, its emitter connected to the collector of said switching transistor, and its collector connected to the output node; and
- clamp delay means interconnected between the collector and the base of said switching transistor for inhibiting the transistor from receiving feedback current to its base so as to cause a faster turn-off, whereby a fast rising edge respose is obtained at the output node during a high-to-low transition of the input logic level signal.

* * * * *